(12) United States Patent
Yagi

(10) Patent No.: US 11,923,843 B2
(45) Date of Patent: Mar. 5, 2024

(54) SEMICONDUCTOR DEVICE AND MEMORY DEVICE

(71) Applicant: Kioxia Corporation, Tokyo (JP)

(72) Inventor: Toshihiro Yagi, Yokohama (JP)

(73) Assignee: Kioxia Corporation, Tokyo (JP)

( * ) Notice: Subject to any disclaimer, the term of this patent is extended or adjusted under 35 U.S.C. 154(b) by 90 days.

(21) Appl. No.: 17/197,565

(22) Filed: Mar. 10, 2021

(65) Prior Publication Data

US 2022/0052689 A1 Feb. 17, 2022

(30) Foreign Application Priority Data

Aug. 17, 2020 (JP) ................................. 2020-137454

(51) Int. Cl.
*H03K 19/00* (2006.01)
*G11C 16/04* (2006.01)

(52) U.S. Cl.
CPC ..... *H03K 19/0005* (2013.01); *G11C 16/0483* (2013.01)

(58) Field of Classification Search
CPC ..... G11C 16/00; G11C 16/0483; G11C 16/26; G11C 2207/00; G11C 2207/2254; G11C 7/00; G11C 7/1057; G11C 7/1066; G11C 7/227; G11C 2207/22; H03K 19/00; H03K 19/0005; H03K 17/00
USPC ................................................... 365/185.18
See application file for complete search history.

(56) References Cited

U.S. PATENT DOCUMENTS

| 6,894,529 B1 * | 5/2005 | Chong ............... H03K 19/0005 |
| | | 326/86 |
| 7,123,055 B1 | 10/2006 | Chong et al. |
| 7,176,729 B2 | 2/2007 | Hayashi et al. |
| 7,262,643 B2 | 8/2007 | Hayashi et al. |
| 7,362,127 B2 | 4/2008 | Tokuhiro et al. |
| 7,443,212 B2 | 10/2008 | Hayashi et al. |
| 8,405,432 B2 | 3/2013 | Koyanagi et al. |
| 8,878,564 B2 | 11/2014 | Araki |

(Continued)

FOREIGN PATENT DOCUMENTS

| JP | 4428504 B2 | 3/2010 |
| JP | 4536449 B2 | 9/2010 |

(Continued)

*Primary Examiner* — Diana J. Cheng
(74) *Attorney, Agent, or Firm* — Oblon, McClelland, Maier & Neustadt, L.L.P.

(57) ABSTRACT

A semiconductor device of an embodiment includes a buffer configured to perform data transmission by turning on and off a first output transistor group and a second output transistor group; a first correction circuit configured to calibrate a resistance value of the buffer by controlling an on-off state of each of first transistors of the first output transistor group; a second correction circuit configured to calibrate the resistance value of the buffer by controlling an on-off state of each of second transistors of the second output transistor group; and a control circuit configured to cause the calibration by the first correction circuit to be performed in a non-communication duration other than a duration of data transmission from the buffer and cause the calibration by the second correction circuit to be performed in a duration other than a duration of the calibration by the first correction circuit.

18 Claims, 16 Drawing Sheets

(56) References Cited

U.S. PATENT DOCUMENTS

| | | | |
|---|---|---|---|
| 10,305,497 B2 | 5/2019 | Nakata | |
| 2004/0251940 A1* | 12/2004 | Hayashi | H03K 19/018585 |
| | | | 327/170 |
| 2008/0211548 A1 | 9/2008 | Hayashi et al. | |
| 2013/0088258 A1* | 4/2013 | Yokou | G11C 11/4093 |
| | | | 326/30 |

FOREIGN PATENT DOCUMENTS

| | | |
|---|---|---|
| JP | 2011-124683 A | 6/2011 |
| JP | 5635459 B2 | 12/2014 |
| JP | 2019-50528 A | 3/2019 |

\* cited by examiner

SEMICONDUCTOR DEVICE AND MEMORY DEVICE

CROSS-REFERENCE TO RELATED APPLICATION

This application is based upon and claims the benefit of priority from the prior Japanese Patent Application No. 2020-137454 filed in Japan on Aug. 17, 2020; the entire contents of which are incorporated herein by reference.

FIELD

Embodiments described herein relate generally to a semiconductor device and a memory device.

BACKGROUND

In some conventional cases, a calibration circuit for reducing impedance variation due to temperature change and voltage change has been included in an output buffer employed for a high-speed interface. For example, the calibration circuit uses a plurality of resistance elements and performs impedance adjustment by switching resistance elements connected with the output buffer. To finely adjust impedance in a wide range, such an output buffer uses a plurality of resistance elements having resistance values, for example, provided with power-of-two weights and selects resistance elements by using a binary code.

However, calibration needs to be performed only in a duration other than communication through the interface because of glitch generation at resistance element switching With this configuration, reflection and crosstalk are generated by impedance variation due to temperature and voltage change in communication, and signal integrity degrades in some cases, which has been a problem.

DETAILED DESCRIPTION

A semiconductor device of an embodiment includes: a buffer configured to perform data transmission by turning on and off a first output transistor group and a second output transistor group; a first correction circuit including the first output transistor group and configured to calibrate a resistance value of the buffer by controlling an on-off state of each of first transistors of the first output transistor group; a second correction circuit including the second output transistor group and configured to calibrate the resistance value of the buffer by controlling an on-off state of each of second transistors of the second output transistor group; and a control circuit configured to cause the calibration by the first correction circuit to be performed in a non-communication duration other than a duration of data transmission from the buffer and cause the calibration by the second correction circuit to be performed in a duration other than a duration of the calibration by the first correction circuit.

Embodiments of the present invention will be described below in detail with reference to the accompanying drawings.

First Embodiment

Figure 1:
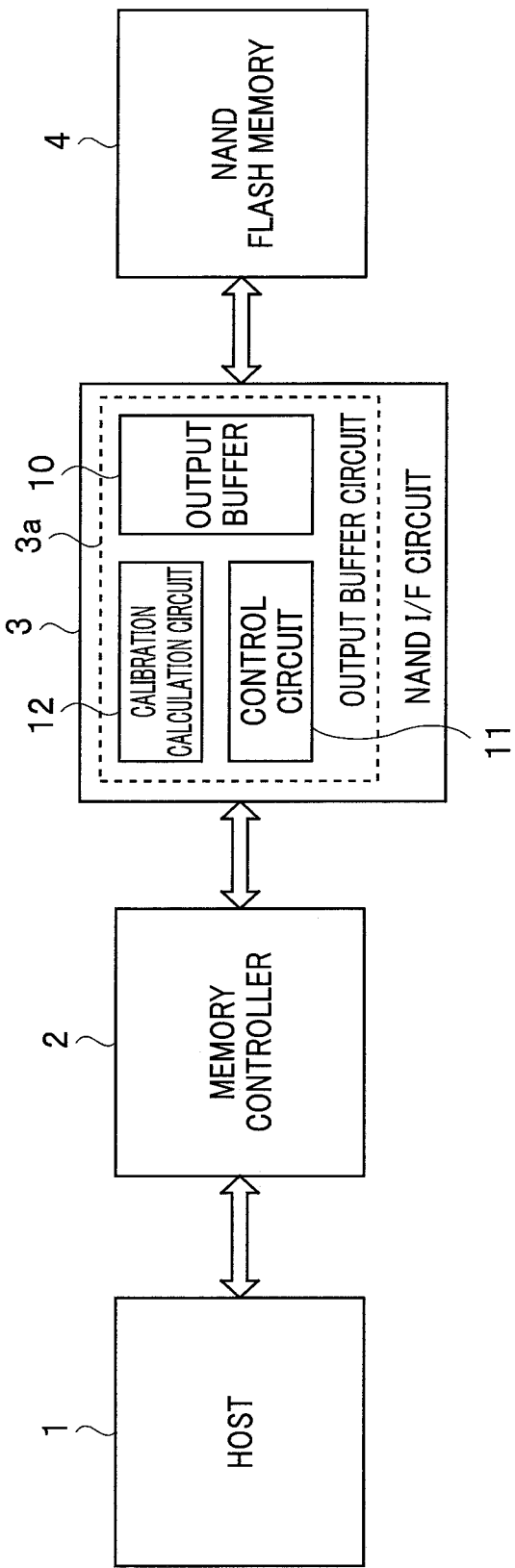
FIG. 1 is a block diagram illustrating a memory device including a semiconductor device according to the present embodiment.
Figure 2:
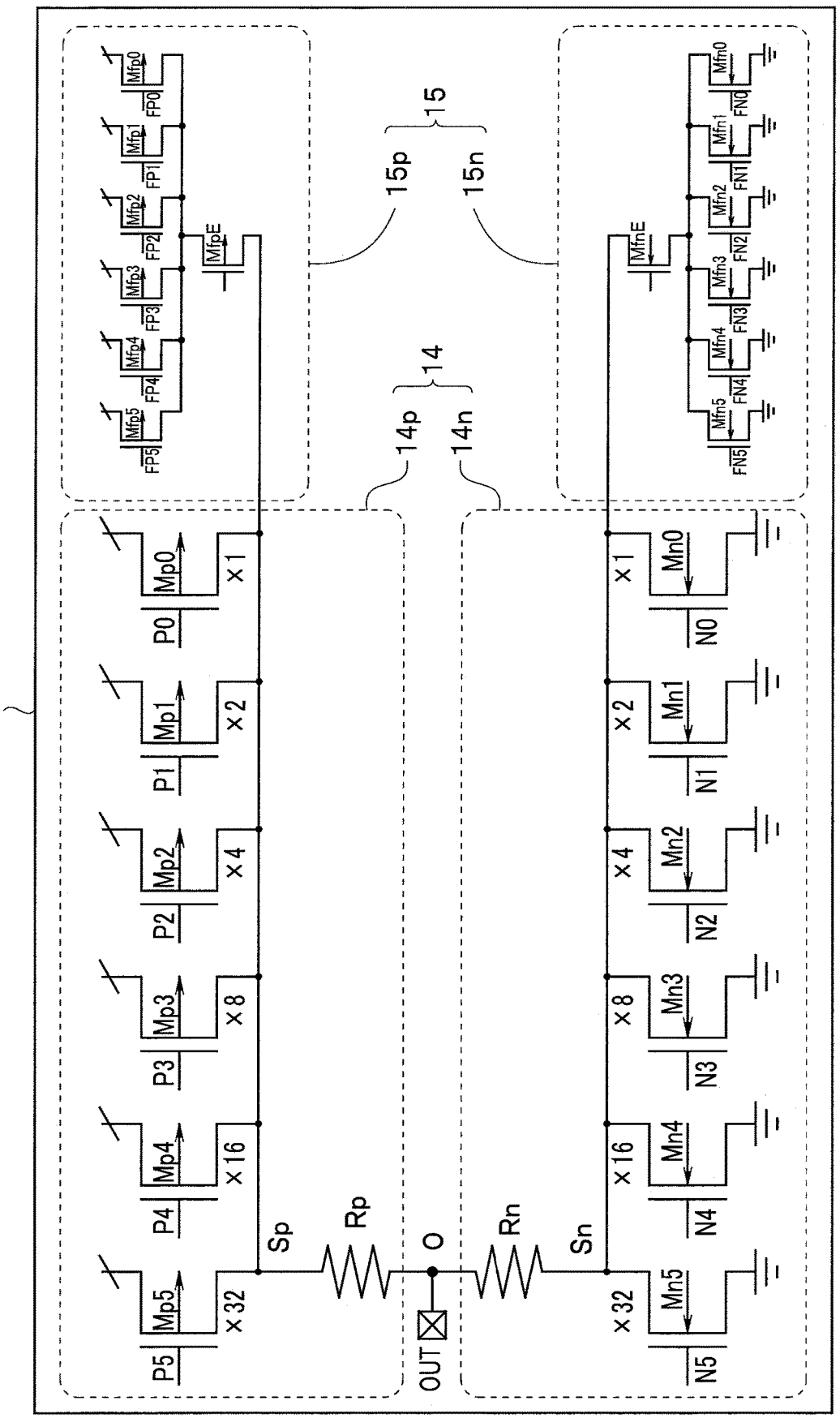
FIG. 2 is a circuit diagram illustrating an output buffer included in the semiconductor device according to the present embodiment.

FIG. 1 is a block diagram illustrating a memory device including a semiconductor device according to the present embodiment. FIG. 2 is a circuit diagram illustrating an output buffer included in the semiconductor device according to the present embodiment.

According to the present embodiment, in an output buffer having a function to calibrate a resistance value, a circuit for performing constant correction is provided outside a circuit for performing correction in non-communication so that calibration can be performed while glitch generation is prevented.

The present embodiment describes an example being applied to an interface circuit (NAND interface circuit) between a NAND flash memory as a non-volatile semiconductor memory device and a memory controller, but is applicable to various interface circuits.

A memory controller 2 in the memory device in FIG. 1 is connected to a host 1 through a predetermined interface. For example, various interfaces such as a parallel interface of an embedded multi media card (eMMC), a serial extended interface of a peripheral component interconnect-express (PCIe), and an M-PHY fast serial interface are employed as the interface. Note that an interface circuit employing the various interfaces are built in each of the host 1 and the memory controller 2.

The memory controller 2 and a NAND flash memory 4 are connected with each other through a NAND interface (I/F) circuit 3. The NAND I/F circuit 3 employs, for example, fast data forwarding mode such as Toggle Double Data Rate (ToggleDDR), and various interfaces such as an open NAND flash interface (ONFI), and performs data forwarding between the memory controller 2 and the NAND flash memory 4.

The host 1 generates writing and reading requests to the memory controller 2. The memory controller 2 controls data writing to the NAND flash memory 4 and data reading from the NAND flash memory 4 in accordance with the requests from the host.

The memory controller 2 and the NAND flash memory 4 perform, through the NAND I/F circuit 3, transmission of various signals such as a signal DQ <7:0> for performing transmission and reception of signals including data, data strobe signals DQS and /DQS, a chip enable signal CE, a command latch enable signal CLE, an address latch enable signal ALE, a write enable signal /WE, read enable signals RE and /RE, and a write protect signal WP.

The NAND I/F circuit 3 includes an output buffer circuit 3a. The output buffer circuit 3a outputs, to the memory controller 2, transmission data from the NAND flash memory 4. The NAND I/F circuit 3 includes another output buffer circuit (not illustrated) having a configuration identical to a configuration of the output buffer circuit 3a so that transmission data from the memory controller 2 is output to the NAND flash memory 4 by the output buffer circuit.

Note that an output buffer circuit having a configuration identical to the configuration of the output buffer circuit 3a in the present embodiment may be built not only in the NAND I/F circuit 3 but also in the host 1, the memory controller 2, and the NAND flash memory 4. The NAND I/F circuit 3 may be omitted, and an interface circuit having functions similar to functions of the NAND I/F circuit 3 may be built in each of the memory controller 2 and the NAND flash memory 4.

The output buffer circuit 3a includes an output buffer 10, a control circuit 11, and a calibration calculation circuit 12. The control circuit 11 controls the entire output buffer circuit 3a and may be configured as a processor using a central processing unit (CPU), a field programmable gate array (FPGA), or the like. The control circuit 11 may be configured to operate in accordance with a program stored in a memory (not illustrated) and control each component. Some or all of functions of the control circuit 11 may be achieved by a hardware electronic circuit. Under control of the control circuit 11, the calibration calculation circuit 12 generates control information for setting a resistance value of the output buffer 10 and supplies the control information to the output buffer 10.

In the present embodiment, the output buffer circuit 3a has a non-communication correction function and a constant correction function for calibration. The non-communication correction function achieves calibration of the resistance value, for example, in each predetermined duration during non-communication in which the output buffer circuit 3a is not performing data transmission. The constant correction function achieves calibration of the resistance value during communication in which the output buffer circuit 3a is performing data transmission or a duration in which calibration by the non-communication correction function is not executed.

Configuration of Output Buffer

Figure 3:
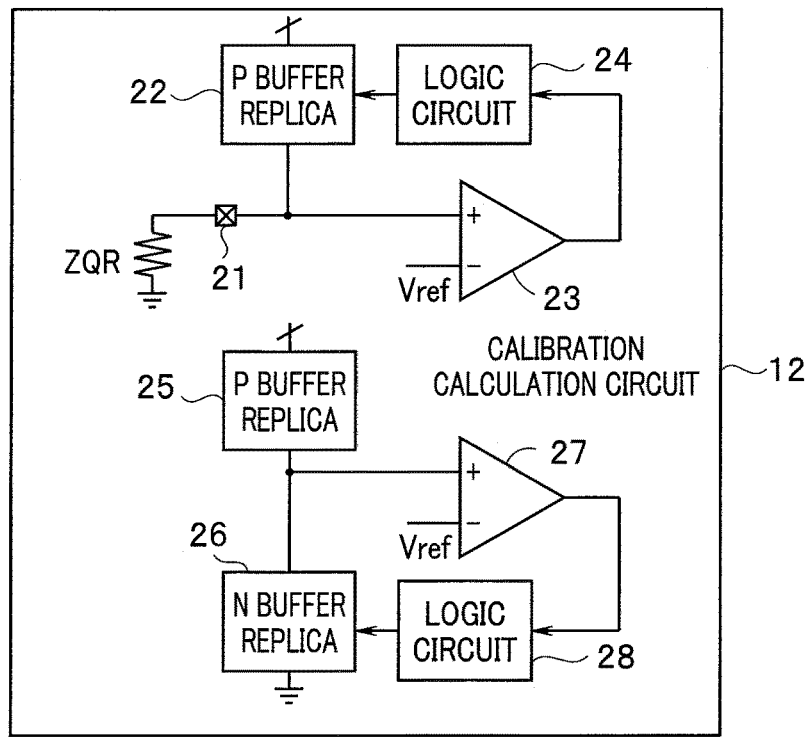
FIG. 3 is a block diagram illustrating an example of a specific configuration of a calibration calculation circuit 12.
Figure 4:
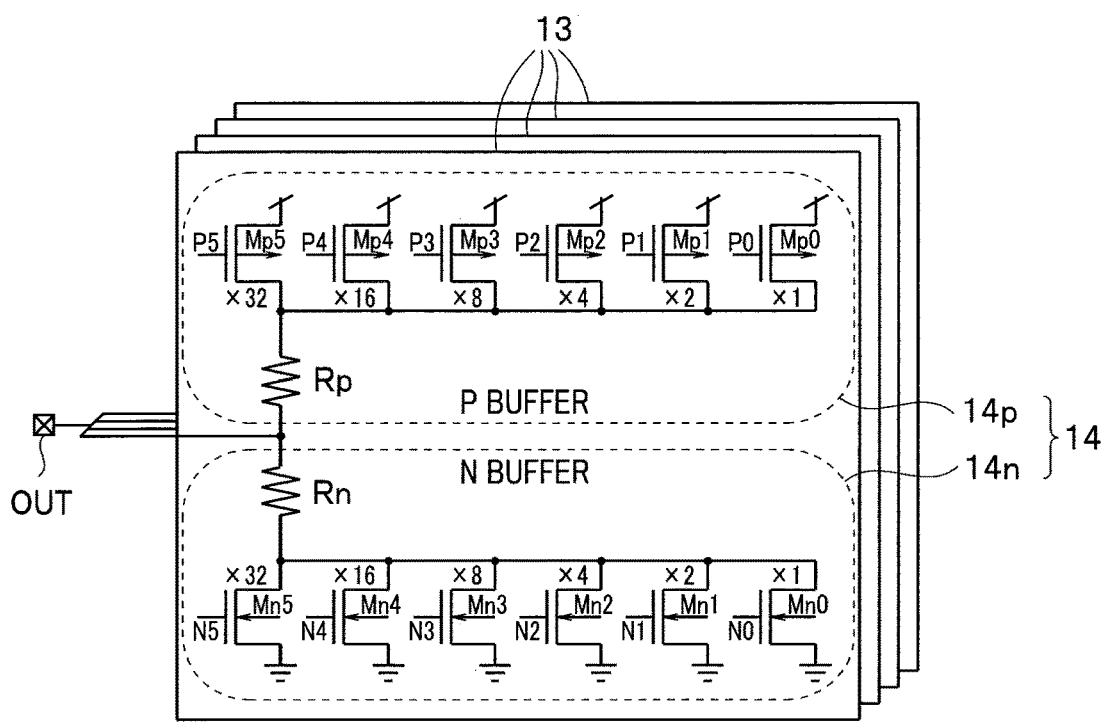
FIG. 4 is a circuit diagram illustrating a comparative example of the output buffer.

FIG. 2 illustrates an example of a specific configuration of the output buffer 10 in FIG. 1. FIG. 3 is a block diagram illustrating an example of a specific configuration of the calibration calculation circuit 12. FIG. 4 is a circuit diagram illustrating a comparative example of the output buffer. Note that, in FIGS. 2 and 4, identical components are denoted by an identical reference sign, and duplicate description of identical configurations are omitted.

The output buffer 10 includes a non-communication correction circuit 14 and a constant correction circuit 15. An output buffer 13 illustrated as the comparative example in FIG. 4 includes only the non-communication correction circuit 14. Note that although FIG. 4 illustrates an example in which four output buffers 13 having identical configurations are used as the output buffer 13, number of output buffers 10 in FIG. 2 is not particularly limited, and for example, one or a plurality of output buffers 10 may be provided.

The non-communication correction circuit 14 includes a P buffer 14p and an N buffer 14n in a first output transistor group. The P buffer 14p includes P-channel MOS transistors Mp0 to Mp5 (hereinafter referred to as transistors Mp when not needing to be distinguished from one another) as first transistors and a resistor Rp. The N buffer 14n includes N-channel MOS transistors Mn0 to Mn5 (hereinafter referred to as transistors Mn when not needing to be distinguished from one another) as first transistors and a resistor Rn.

Source and drain paths of the P-channel MOS transistor Mp5, the resistor Rp, the resistor Rn, and drain and source paths of the N-channel MOS transistor Mn5 are connected in series between a power source terminal and a reference potential point. A connection point (hereinafter referred to as a node O) of the resistor Rp and the resistor Rn is connected with an output terminal OUT. Note that the resistors Rp and Rn are provided to reduce linearity degradation due to temperature variation and voltage variation.

Source and drain paths of the transistors Mp4 to Mp0 are connected in parallel with the source and drain paths of the transistor Mp5. Control signals P0 to P5 are supplied to gates of the transistors Mp0 to Mp5, respectively. Drain and source paths of the transistors Mn4 to Mn0 are connected in parallel with the drain and source paths of the transistor Mn5. Control signals N0 to N5 are supplied to gates of the transistors Mn0 to Mn5, respectively.

The control circuit 11 provides the control signals P0 to P5 (hereinafter referred to as control signals P when not distinguished from one another) and N0 to N5 (hereinafter referred to as control signals N when not distinguished from one another) in accordance with transmission data to the respective gates of the transistors Mp0 to Mp5 and Mn0 to Mn5. The output terminal OUT becomes a high level when any of the transistors Mp0 to Mp5 is turned on and the transistors Mn are turned off by the control signals P and N. The output terminal OUT becomes a low level when the transistors Mp are turned off and any of the transistors Mn0 to Mn5 is turned on. Data in accordance with the control signals P and N is transmitted from the output terminal OUT.

In the comparative example in FIG. 4, only the non-communication correction circuit 14 is provided, and the resistance value of the output buffer 13 is determined in accordance with a transistor turned on (activated) among the transistors Mp and Mn. The resistance value (on-resistance) of each transistor can be changed through settings of a gate length, a gate width, and the like. The resistance value of the output buffer can be finely adjusted in a wide range with a small number of transistors by setting the resistance values of the transistors Mp and Mn to values different from each other, for example, providing power-of-two weights. Calibration to adjust the resistance value of the output buffer 13 can be achieved by controlling transistors turned on (activated) through the control signals P and N.

Note that, in the examples in FIGS. 2 and 4, the resistance values of the transistors Mp0, Mp2, Mp3, Mp4, and Mp5 are two times (×2), four times (×4), eight times (×8), 16 times (×16), and 32 times (×32), respectively larger than the resistance value (×1) of the transistor Mp0. Similarly, the resistance values of the transistors Mn1, Mn2, Mn3, Mn4, and Mn5 are two times (×2), four times (×4), eight times (×8), 16 times (×16), 32 times (×32), respectively, larger than the resistance value (×1) of the transistor Mn0.

Problems of Comparative Example

Figure 5:
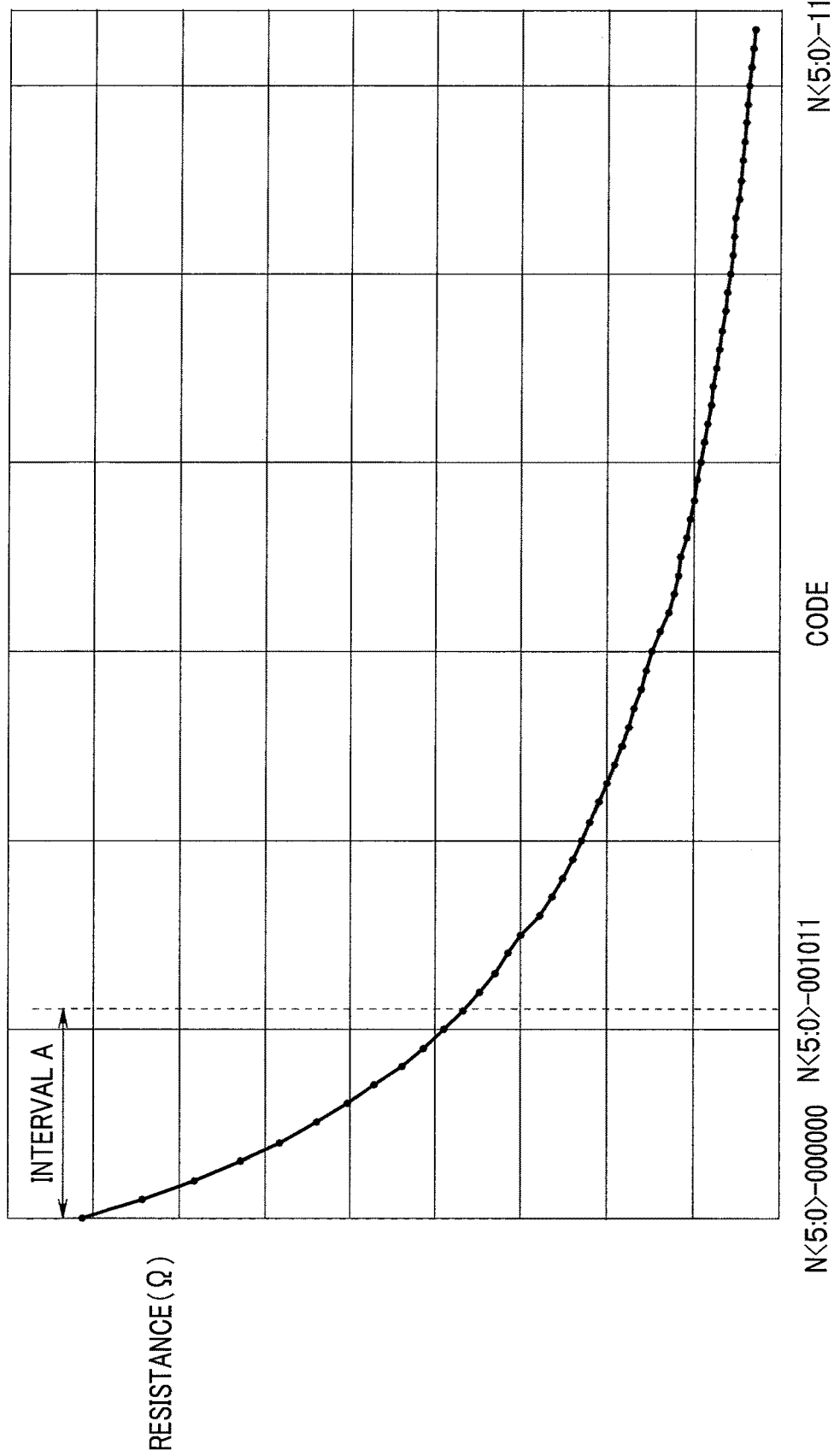
FIG. 5 is a graph illustrating a relation between a code as a combination of control signals provided to gates of transistors Mp0 to Mp5 or transistors Mn0 to Mn5 and a resistance value of an output buffer 13 corresponding to the code in the comparative example in FIG. 4, a horizontal axis representing the code and a vertical axis representing the resistance value.

FIG. 5 is a graph illustrating a relation between a code as a combination of control signals provided to the gates of the respective transistors Mp0 to Mp5 or Mn0 to Mn5 and the resistance value of the output buffer 13 corresponding to the code in the comparative example in FIG. 4, a horizontal axis representing the code and a vertical axis representing the resistance value.

The code corresponds to control signals provided to the gates of the transistors Mp5 to Mp0 or the transistors Mn5 to Mn0 by respective bits of a most significant bit to a least significant bit. Each bit of the code indicates a state in which the corresponding transistor is on when the bit is "1", or indicates a state in which the transistor is off when the bit is "0". For example, a code N<5:0>-000000 indicates that all transistors Mp5 to Mp0 or all transistors Mn5 to Mn0 are off. In this case, the resistance value of the P buffer 14p and the resistance value of the N buffer 14n are maximum, and the resistance value of the output buffer 13 is maximum. For example, a code N<5:0>-111111 indicates that all transistors Mp5 to Mp0 or all transistors Mn5 to Mn0 are on. In this case, the resistance value of the P buffer 14p and the resistance value of the N buffer 14n are minimum, and the resistance value of the output buffer 13 is minimum. For example, a code N<5:0>-001011 indicates that the transistors Mp3, Mp1, and Mp0 (Mn3, Mn1, and Mn0) are on and the transistors Mp5, Mp4, and Mp2 (Mn5, Mn4, and Mn2) are off.

Note that each of the transistors Mp and each of the transistors Mn has a resistance value corresponding to a power-of-two weight. Thus, a change amount of the resistance value of the output buffer 13 due to change on a higher-order bit side of the code is large. In Interval A in FIG. 5, the resistance value has a low one-bit resolution and a relatively large quantization error, which is a problem.

Furthermore, the on-resistance of a transistor is indefinite at a moment of switching through which the transistor is turned on or off. In this case as well, for example, when only an on-off state of the transistor Mp0 having a relatively small resistance value among the transistors Mp and Mn is switched, change of the resistance value of the P buffer 14p and the N buffer 14n as a whole is relatively small as illustrated in FIG. 5, and influence of indefiniteness is relatively small. However, when on-off states of one or more transistors having relatively large resistance values among the transistors Mp and Mn are switched, the resistance values of a plurality of transistors having large resistance values become indefinite, and thus the resistance value of the P buffer 14p and the N buffer 14n as a whole relatively largely varies at a moment of the switching. As a result, a glitch occurs to output data.

For example, consider a case in which the resistance value needs to be increased, due to temperature variation or the like, by the weight of the transistor Mp0 or Mn0 (1×) from a state of a code N<5:0>-011111, namely, a state in which only the transistor Mp5 or Mn5 having the heaviest weight (×32) is off and the other transistors are on, in other words, a case in which the code is changed to a code N<5:0>-100000. In this case, on-off states of all transistors Mp or Mn are switched. Accordingly, at switching of the on-off states of the transistors, the transistor Mp5 or Mn5 is turned on first, and all transistors Mp or Mn are turned on (equivalent to the code N<5:0>-111111) for a moment in some cases. In addition, the transistor Mp5 or Mn5 is turned on late, and all transistors Mp or Mn are turned off (equivalent to the code N<5:0>-000000) for a moment in some cases. In these cases, a resistance value significantly different from a desired resistance value is set for a moment, and a glitch occurs. Note that a larger glitch is likely to occur when the on-off state of a transistor having a heavier weight is switched.

For this reason, calibration is performed only in non-communication in the comparative example in FIG. 4. However, with this configuration, signal integrity degrades in communication in some cases, which is another problem.

Figure 6:
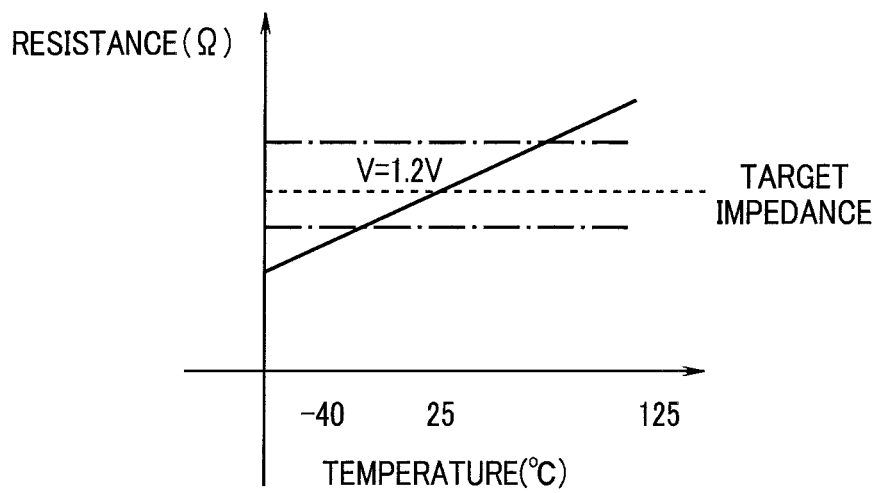
FIG. 6 is a graph illustrating change of the resistance value of the output buffer, a horizontal axis representing temperature and a vertical axis representing the resistance value.
Figure 7:
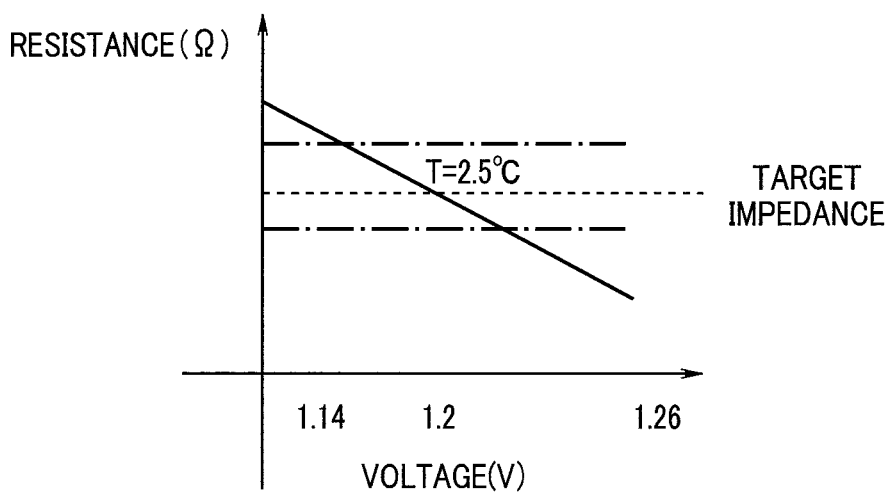
FIG. 7 is a graph illustrating change of the resistance value of the output buffer, a horizontal axis representing voltage and a vertical axis representing the resistance value.

FIG. 6 is a graph illustrating change of the resistance value of the output buffer, a horizontal axis representing temperature and a vertical axis representing the resistance value. FIG. 7 is a graph illustrating change of the resistance value of the output buffer, a horizontal axis representing voltage and a vertical axis representing the resistance value.

In FIGS. 6 and 7, a dashed line represents a target resistance value to be set as the resistance value of the output buffer. FIG. 6 illustrates the target resistance value when power voltage is 1.2 V and temperature is 25° C. As illustrated in FIG. 6, the resistance value of the output buffer relatively largely varies in response to temperature change. In FIGS. 6 and 7, dashed and single-dotted lines represent an allowable range of the resistance value. As illustrated in FIG. 6, the resistance value exceeds the allowable range upon temperature change in actual use. In addition, as illustrated in FIG. 7, the resistance value of the output buffer relatively largely varies in response to voltage change, and exceeds the allowable range represented by the dashed and single-dotted lines upon voltage change in actual use.

As illustrated in FIGS. 6 and 7, the resistance value of the output buffer largely varies right after correction in an environment in which temperature and voltage vary. Thus, when calibration is performed only in non-communication as in the comparative example in FIG. 4, signal integrity degrades in communication in some cases.

Configuration

In the present embodiment, the constant correction circuit 15 is added to solve the above-described problems. In FIG. 2, the output buffer 10 is different from the comparative example in FIG. 4 in that the constant correction circuit 15 is provided. Note that, in the present embodiment, the non-communication correction circuit 14 is used for coarse adjustment of the resistance value, and the constant correction circuit 15 is used for fine adjustment of the resistance value. Thus, the non-communication correction circuit 14 is also referred to as a coarse adjustment circuit, and the constant correction circuit 15 is also referred to as a fine adjustment circuit.

In FIG. 2, the P buffer 14p, the N buffer 14n, and the resistors Rp and Rn have configurations same as configurations in the comparative example in FIG. 4. The constant correction circuit 15 includes a fine P buffer 15p and a fine N buffer 15n in a second output transistor group. The fine P buffer 15p includes a plurality of PMOS transistors Mfp0 to Mfp5 (hereinafter referred to as transistors Mfp when not needing to be distinguished from one another) having sources connected with the power source terminal, drains connected in common, and source and drain paths connected in parallel, and includes a PMOS transistor MfpE. The transistor MfpE as a switching transistor has a source connected with the drain of each transistor Mfp, and a drain connected with the drain of each transistor Mp. Note that a connection point of the drain of each of the transistors Mp and MfpE and the resistor Rp is referred to as a node Sp below.

The fine N buffer 15n includes a plurality of NMOS transistors Mfn0 to Mfn5 (hereinafter referred to as transistors Mfn when not needing to be distinguished from one another) having sources connected with the reference potential point, drains connected in common, and drain and source paths connected in parallel, and includes a NMOS transistor MfnE The transistor MfnE as a switching transistor has a source connected with the drain of each transistor Mfn, and a drain connected with the drain of each transistor Mn. Note that a connection point of the drain of each of the transistors Mn and MfnE and the resistor Rn is referred to as a node Sn below.

In the present embodiment, a transistor having a sufficiently small resistance value is employed as each transistor Mfp that is a second transistor in the fine P buffer 15p, For example, a transistor having a resistance value equal to the resistance value (×1) of the transistor Mp0 may be employed as each transistor Mfp. The transistor MfpE has a stack configuration in which source and drain paths are disposed in series on the source and drain paths of each transistor Mfp to reduce an increase of pin capacitance of the output terminal OUT and reduce static electricity.

Similarly, a transistor having a sufficiently small resistance value is employed as each transistor Mfn that is a second transistor in the fine N buffer 15n. For example, a transistor having a resistance value equal to the resistance value (×1) of the transistor Mn0 may be employed as each transistor Mfn. The transistor MfnE has a stack configuration in which source and drain paths are disposed in series on source and drain paths of each transistor Mfn to reduce an increase of the pin capacitance of the output terminal OUT and reduce static electricity.

Note that the numbers of transistors Mfp and Mfn included in the fine P buffers 15p and 15n may be set as appropriate. The numbers may be determined in accordance with, for example, a fraction at which adjustment is performed relative to an adjustment width (hereinafter referred to as a coarse minimum adjustment width) through calibration of the resistance value of the output buffer 10 by the transistors Mp and Mn having lightest weights in the non-communication correction circuit 14 (hereinafter referred to as coarse calibration or coarse adjustment).

As described later, calibration of the resistance value of the output buffer 10 by the constant correction circuit 15 (hereinafter referred to as fine calibration or fine adjustment) is performed in a duration between a time right after coarse calibration and a next coarse calibration. Thus, a variation amount of the resistance value in the duration may be set as a correction range of fine calibration. For example, (a): the numbers and resistance values of transistors Mfp and Mfn may be set so that the correction range of fine calibration is ⅛ of the coarse minimum adjustment width approximately. Alternatively, (b): the coarse minimum adjustment width may be determined based on a room-temperature test in a semiconductor wafer examination process, and the variation amount of the resistance value may be set as the correction range of fine calibration.

All transistors Mfp and Mfn are set to the same resistance value in an example of the above description, but may be set to resistance values different from each other. For example, the transistors Mfp and Mfn may be divided into a plurality of groups, and a different resistance value may be set to each group. Note that the resistance values of the transistors Mfp and Mfn are desirably set to be equal to or smaller than the resistance values (×1) of the transistors Mp0 and MN0, which are smallest. For example, the resistance values of the transistors Mfp and Mfn may be equal to the resistance values of the transistors Mp0 and Mn0 as described above or may be equal to integer divisions of the resistance values of the transistors Mp0 and Mn0. Alternatively, the resistance values of the transistors Mfp and Mfn may be resistance values other than integer divisions of the resistance values of the transistors Mp0 and Mn0 to achieve further accuracy improvement.

FIG. 3 is a block diagram illustrating a specific exemplary configuration of the calibration calculation circuit 12.

The calibration calculation circuit 12 includes P buffer replicas 22 and 25 having configurations identical to configurations of the P buffer 14p and the fine P buffer 15p, and an N buffer replica 26 having a configuration identical to configurations of the N buffer 14n and the fine N buffer 15n. In the P buffer replica 22, one end (node O) of the resistor Rp is connected with positive input ends of a terminal 21 and a comparator 23. The terminal 21 is connected with an external resistor ZQR. Voltage Vref that is equal to ½ of power voltage supplied to the P buffer replica 22 is applied to a negative input end of the comparator 23. The comparator 23 compares two inputs and outputs a result of the comparison to a logic circuit 24. The logic circuit 24 generates a control signal based on the result of the comparison by the comparator 23 and provides the generated control signal to the gates of the transistors Mp and Mfp of the P buffer replica 22.

The control signal applied to the gates of the transistors Mp and Mfp of the P buffer replica 22 is determined through a loop formed by the P buffer replica 22, the comparator 23, and the logic circuit 24 so that the resistance value of the P buffer replica 22 matches the external resistor ZQR. The calibration calculation circuit 12 applies, to the gates of the transistors Mp and Mfp of the P buffer replica 25 as well, the control signals applied to the gates of the transistors Mp and Mfp of the P buffer replica 22.

The P buffer replica 25 and the N buffer replica 26 have configurations identical to the configuration of the output buffer 10 in FIG. 2. A connection point (node O) of the P buffer replica 25 and the N buffer replica 26 is connected with a positive input end of a comparator 27. Voltage Vref equal to the voltage supplied to the negative input end of the comparator 23 is applied to a negative input end of the comparator 27. The comparator 27 compares two inputs and outputs a result of the comparison to a logic circuit 28. The logic circuit 28 generates a control signal based on the result of the comparison by the comparator 27 and provides the generated control signal to the gates of the transistors Mn and Mfn of the N buffer replica 26.

The control signal applied to the gates of the transistors Mn and Mfn of the N buffer replica 26 is determined through a loop formed by the P buffer replica 25, the N buffer replica 26, the comparator 27, and the logic circuit 28 so that the resistance value of the N buffer replica 26 matches the resistance value of the P buffer replica 25. As a result, the calibration calculation circuit 12 can generate a control signal for causing the resistance values of the P buffer replica 25 and the N buffer replica 26 to match the external resistor ZQR irrespective of temperature variation and voltage variation. The control circuit 11 performs calibration by supplying the control signal generated by the calibration calculation circuit 12 to the gates of the transistors Mp, Mn, Mfp, and Mfn included in the non-communication correction circuit 14 and the constant correction circuit 15.

Note that the calibration calculation circuit 12 generates a code by loop control through the P buffer replica 22, the comparator 23, and the logic circuit 24 and generates a code by loop control through the P buffer replica 25, the N buffer replica 26, the comparator 27, and the logic circuit 28 in the described example. However, during communication, power source environment becomes unstable and power voltage and reference potential vary in some cases. Thus, the calibration calculation circuit 12 may perform loop control a plurality of times and generate a code by averaging the loop control.

Effects

Figure 8:
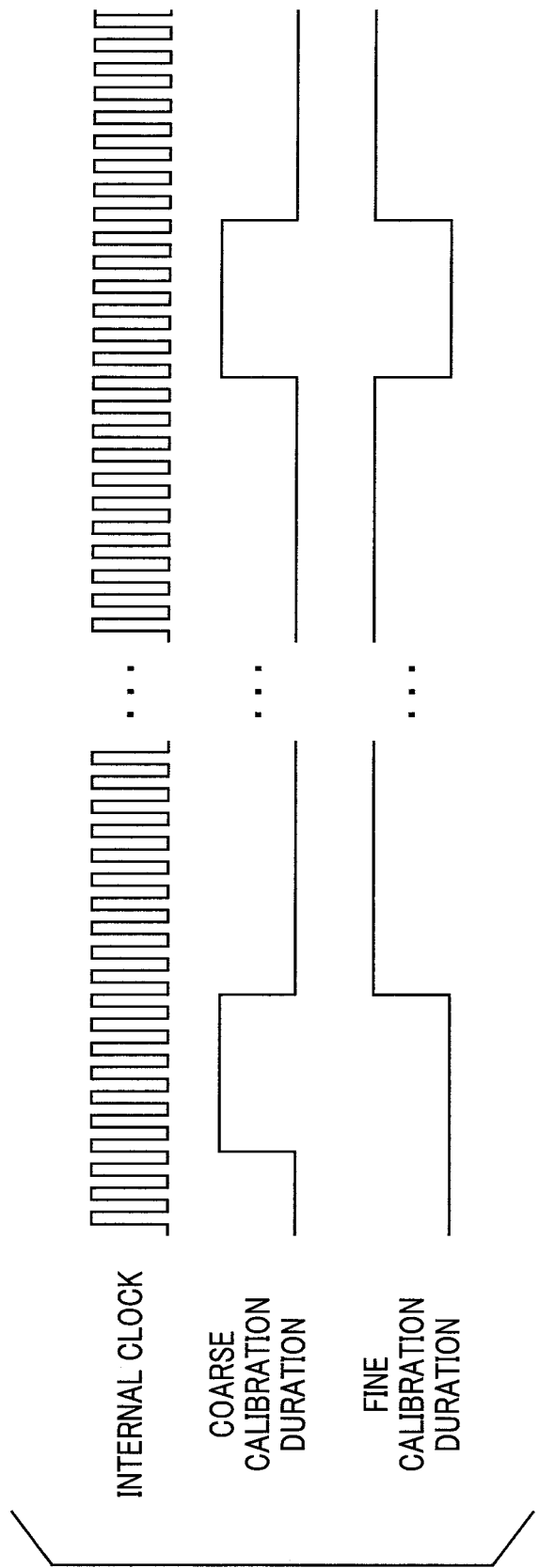
FIG. 8 is a timing chart illustrating operation in the present embodiment.
Figure 9:
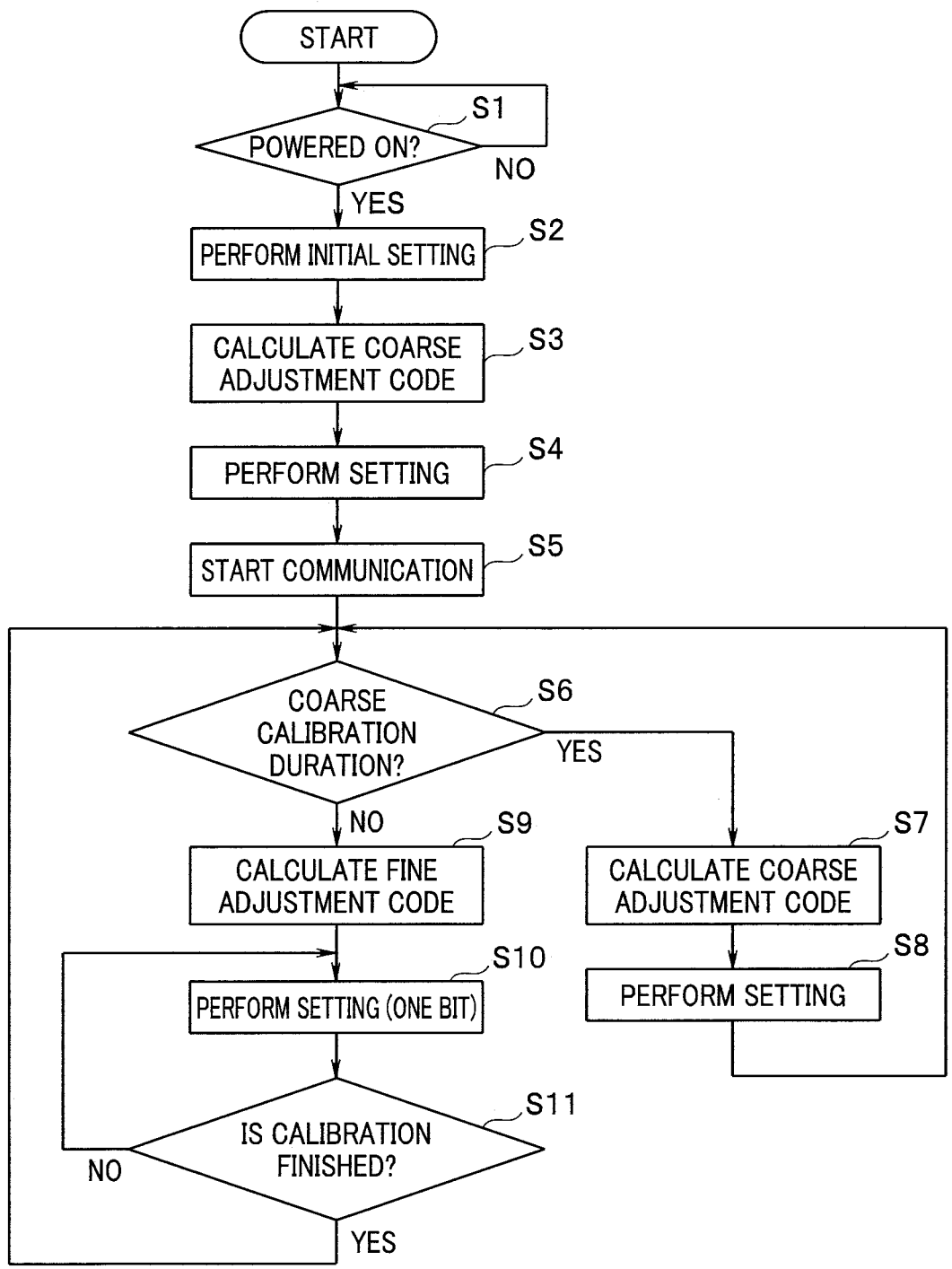
FIG. 9 is a flowchart for description of the operation.
Figure 10:
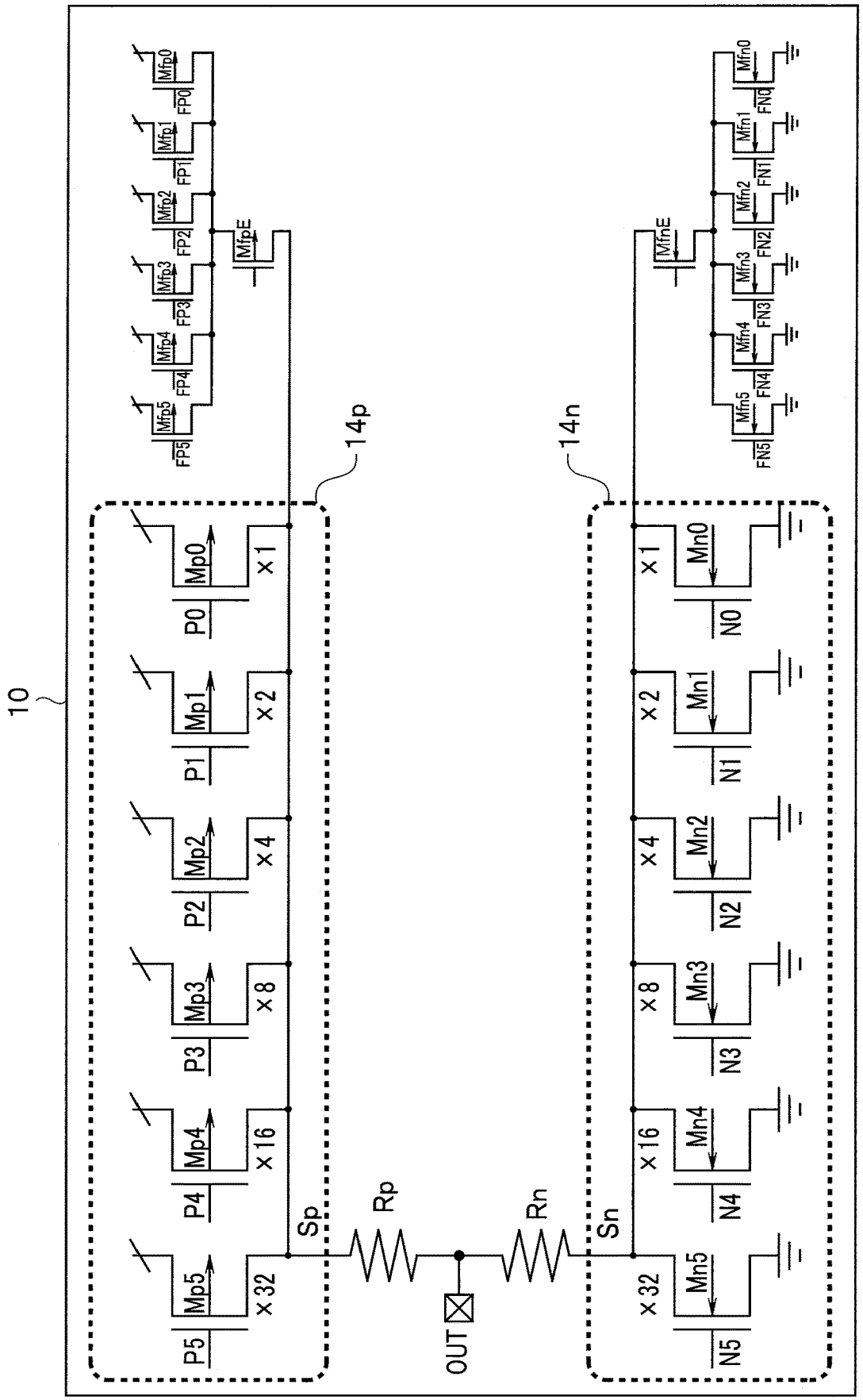
FIG. 10 is an explanatory diagram for description of the operation.
Figure 11:
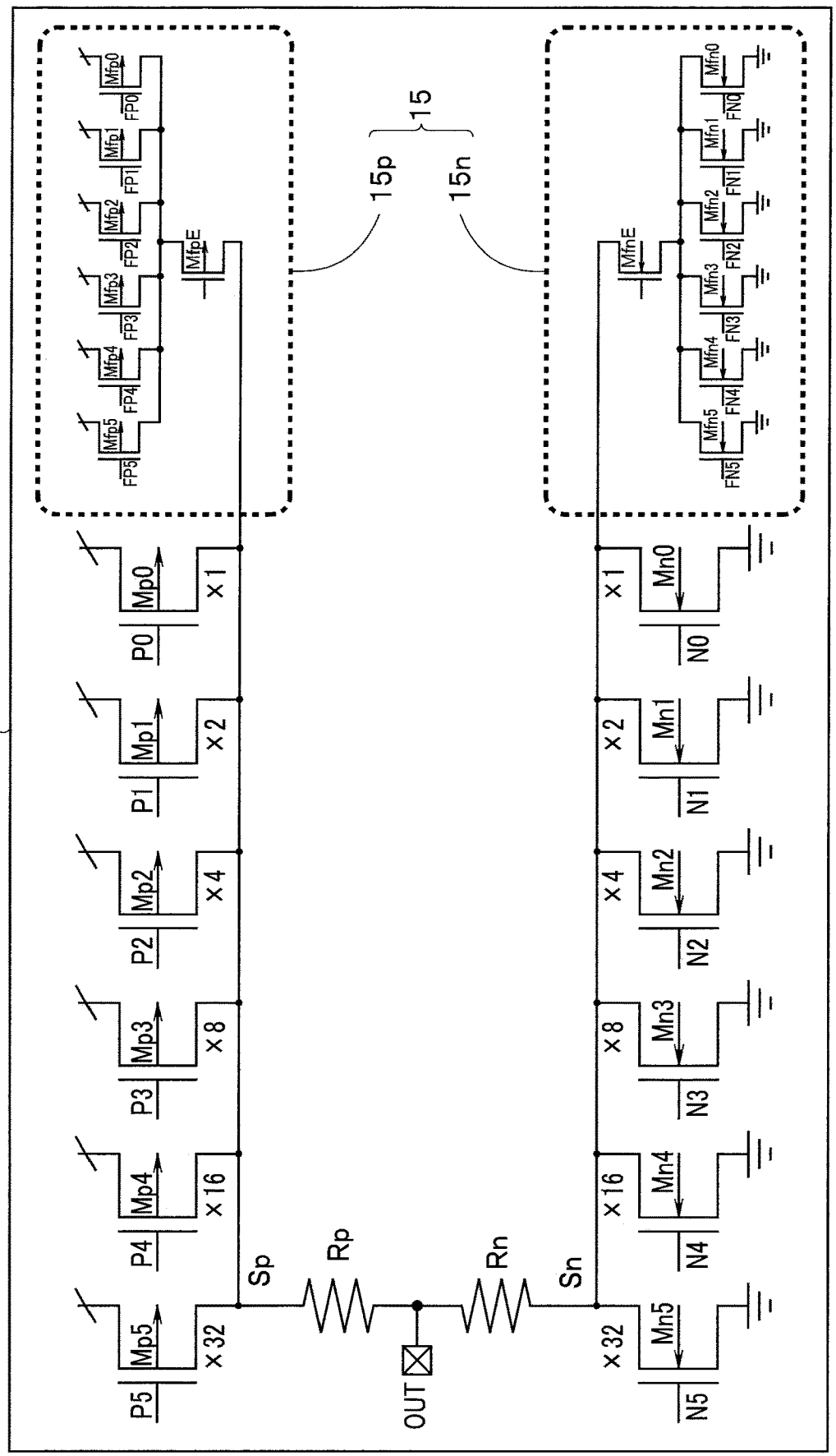
FIG. 11 is an explanatory diagram for description of the operation.
Figure 12:
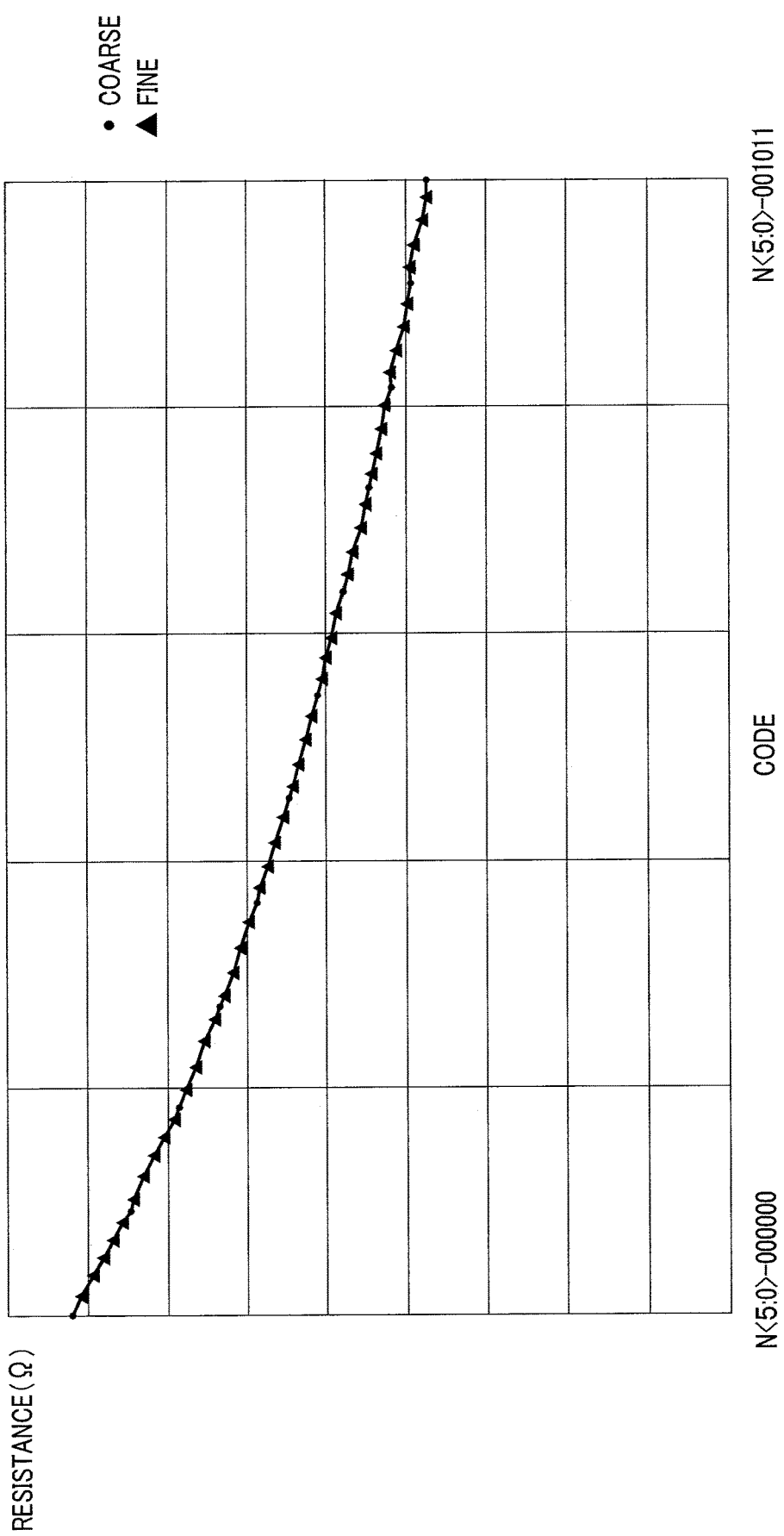
FIG. 12 is a graph for description of a resistance value in the embodiment.

Subsequently, operation of the embodiment thus configured will be described below with reference to FIGS. 8 to 12. FIG. 8 is a timing chart illustrating the operation in the present embodiment. FIG. 9 is a flowchart for description of the operation. FIGS. 10 and 11 are explanatory diagrams for description of the operation. FIG. 12 is a graph for description of a resistance value in the embodiment.

The control circuit 11 of the output buffer circuit 3a performs calibration of the resistance value of the output buffer 10. As described above, coarse calibration by the non-communication correction circuit 14 of the output buffer 10 is performed in non-communication. For example, the control circuit 11 receives, from outside, a calibration instruction command that instructs coarse calibration in some cases. Alternatively, the control circuit 11 independently instructs coarse calibration in some cases. The control circuit 11 executes coarse calibration in a duration (hereinafter referred to as a coarse calibration duration) in which coarse calibration is performed in response to the calibration instruction command or an independently set coarse calibration duration.

The control circuit 11 may perform fine calibration by the constant correction circuit 15 in the entire duration other than the coarse calibration duration.

FIG. 8 illustrates an internal clock used in the output buffer circuit 3a, the coarse calibration duration (high level duration), and a duration (hereinafter referred to as a fine calibration duration) (high level duration) in which fine calibration is performed by the constant correction circuit 15. In FIG. 8, the fine calibration duration is set to be the entire duration except for the coarse calibration duration, which indicates that calibration is constantly performed in the initial coarse calibration duration and later.

Note that FIG. 8 shows an example, and the control circuit 11 may perform fine calibration in each constant duration or at optional timings in the duration other than the coarse calibration duration. Alternatively, for example, the control circuit 11 may perform coarse calibration right before communication starts and may perform fine calibration during the communication. Alternatively, the control circuit 11 may perform coarse calibration in accordance with the calibration instruction command from the outside, independently perform coarse calibration in each predetermined duration, and perform fine calibration in the duration other than the coarse calibration duration.

Thus, in the present embodiment, the control circuit 11 may perform coarse calibration at an appropriate timing in a non-communication duration irrespective of the calibration instruction command from the outside and may perform fine calibration in a communication duration.

FIG. 9 illustrates an example of control by the control circuit 11 thus configured.

When the output buffer circuit 3a is powered on at step S1 in FIG. 9, the control circuit 11 performs various kinds of initial setting in the output buffer circuit 3a at step S2. Subsequently at step S3, the control circuit 11 generates a coarse adjustment code as a combination of control signals used for coarse calibration. Note that, in FIG. 10, each dashed line frame surrounds transistors, control signals to which change in accordance with temperature variation and voltage variation in coarse calibration.

The control circuit 11 instructs the calibration calculation circuit 12 to perform coarse calibration calculation that generates a coarse adjustment code. The logic circuit 24 generates a code to be set to the P buffer replica 22 and provides the generated code to the P buffer replica 22, thereby causing the resistance value of the P buffer replica 22 to match the external resistor ZQR.

In coarse calibration calculation of the present embodiment, the logic circuit 24 generates a fixed code for the transistors Mfp in the P buffer replica 22 and turns on the transistor MfpE to change a code for the transistors Mp so that the resistance value of the P buffer replica 22 matches the external resistor ZQR. For example, the logic circuit 24 may generate a fixed code for the transistors Mfp so that a median of maximum resistance values obtained by the transistors Mfp or a value close to the median is obtained. For example, when the resistance values of each of the transistors Mfp have equal weights, half of the transistors Mfp may be turned on and the remaining half may be turned off. In the example illustrated in FIG. 2, three of the transistors Mfp are turned on and the remaining three transistors are turned off. Accordingly, in fine calibration to be described later, resistance value fine adjustment can be performed in any of positive and negative directions.

The logic circuit 24 provides the code generated for the P buffer replica 22 also to the P buffer replica 25. The logic circuit 28 generates a code to be set to the N buffer replica 26 and provides the generated code to the N buffer replica 26 so that the resistance value of the N buffer replica 26 matches the resistance value of the P buffer replica 25, in other words, the external resistor ZQR. In this case as well, the logic circuit 28 may generate a fixed code for the transistors Mfn so that a median of maximum resistance values obtained by the transistors Mfn or a value close to the median is obtained. For example, when the resistance values of each of the transistors Mfn have equal weights, half (three in FIG. 2) of the transistors Mfn may be turned on and the remaining half may be turned off.

At step S4, the control circuit 11 enables drive of the transistors Mp, Mn, Mfp, and Mfn of the output buffer 10 by using the code (coarse adjustment code) generated for the transistors Mfp and Mfn by the logic circuits 24 and 28. In this state, the control circuit 11 drives the output buffer 10 based on transmission data and starts communication (step S5).

At step S6, the control circuit 11 determines whether the coarse calibration duration is reached. For example, when the calibration instruction command is received from the outside or when an independently set calibration duration is reached, the control circuit 11 advances the process to step S7 to calculate a coarse adjustment code and drives the output buffer 10 by using the coarse adjustment code (step S8). Note that processing at steps S7 and S8 is same as processing at steps S3 and S4.

In the present embodiment, when having determined that the coarse calibration duration is not reached, the control circuit 11 advances the process from step S6 to step S9 and operates the constant correction circuit 15 to instruct the calibration calculation circuit 12 to calculate a fine adjustment code for executing fine calibration. Note that, in FIG. 11, each dashed line frame surrounds transistors, control signals to which change in accordance with temperature variation and voltage variation in fine calibration.

In the present embodiment, control signals for the transistors Mp and Mn of the P buffer 14p and the N buffer 14n of the non-communication correction circuit 14 in the coarse adjustment code do not change in fine calibration. Accordingly, the logic circuit 24 provides, to the P buffer replica 22, a code (fine adjustment code) acquired by changing only the code for each of the transistors Mfp and Mfn while maintaining the code set to each of the transistors Mp and Mn at step S7 so that the resistance value of the P buffer replica 22 matches the external resistor ZQR.

The logic circuit 24 provides, to the P buffer replica 25, the code calculated for the P buffer replica 22. The logic circuit 28 generates a code set to the N buffer replica 26 and provides the generated code to the N buffer replica 26 so that the resistance value of the N buffer replica 26 matches the resistance value of the P buffer replica 25, in other words, the external resistor ZQR.

As described above, with the coarse adjustment code, resistance values of the fine P buffer 15p and the fine N buffer 15n can be adjusted in any of positive and negative directions, and the resistance values of the P buffer replica 25 and the N buffer replica 26 can be reliably set to desired resistance values in accordance with temperature variation and voltage variation.

The control circuit 11 sets the fine adjustment code acquired by each of the logic circuits 24 and 28 to the output buffer 10 at step S10. In the present embodiment, the control circuit 11 changes the fine adjustment code by one bit at a time and determines whether a target fine adjustment code is obtained at step S11. The control circuit 11 repeats processing at steps S10 and S11 until the target fine adjustment code is obtained. For example, at step S9, a fine adjustment code indicating that the two transistors Mfp and Mfn are changed from off to on is obtained for the coarse adjustment code acquired at step S7. In this case, only one of the transistors is switched from off to on first at step S10, and then the other transistor is switched from off to on after the process is returned from step S11 to step S10.

Thus, in fine calibration of the present embodiment, a thermometer code is employed as the fine adjustment code, and only the on-off state of one transistor is switched at a timing. In addition, similarly to the resistance values of the transistors Mp0 and Mn0, the resistance values of the transistors Mfp and Mfn have lightest weights, and glitch generation is prevented at change of the resistance values of the fine P buffer 15p and the fine N buffer 15n. As a result, in the present embodiment, it is possible to perform fine calibration while preventing a glitch in the duration other than the coarse calibration duration, for example, in communication, and it is possible to prevent degradation of signal integrity irrespective of temperature variation and voltage variation.

Note that when all transistors Mfp and Mfn are turned on or off as a result of fine calibration by the constant correction circuit 15, the control circuit 11 may perform calibration by the non-communication correction circuit 14 in the fine calibration duration.

Although an example in which fine calibration is performed in the entire duration other than the coarse calibration duration is described above with the flowchart in FIG. 9, fine calibration may be executed periodically in every predetermined duration or at any timing in any of communication and non-communication.

FIG. 12 illustrates a relation between a fine adjustment code as a combination of control signals provided to the gates of the transistors Mp, Mn, Mfp, and Mfn and the resistance value of the output buffer 10 corresponding to the fine adjustment code, a horizontal axis representing the code and a vertical axis representing the resistance value. In FIG. 12, an interval corresponding to Interval A in FIG. 5 is illustrated.

As described above, the code provided to the transistors Mp and Mn in a coarse adjustment code does not change in a fine adjustment code, either. In FIG. 12, the code N<5: 0>-000000 and the code N<5:0>-000000 are codes provided to the transistors Mp and Mn. In FIG. 12, a circle indicates a resistance value that can be obtained with a coarse adjustment code, and a triangle indicates a resistance value that can be obtained with a fine adjustment code. As illustrated with each circle, the resistance value that can be obtained with a coarse adjustment code has a relatively large quantization error. However, as illustrated with each triangle, the resistance value that can be obtained with a fine adjustment code has a value between resistance values of coarse adjustment, which are illustrated with circles, and thus a resistance value quantization error can be reduced.

In the present embodiment, as described above, fine calibration is constantly or, for example, periodically performed in addition to coarse calibration performed in non-communication, and a thermometer code is employed as a fine adjustment code for controlling fine calibration, thereby reducing resistance value variation at switching of the on-off state of any transistor for changing the resistance value of the output buffer. Accordingly, it is possible to perform calibration while preventing glitch generation in communication, and it is possible to prevent degradation of signal integrity irrespective of temperature variation and voltage variation. In addition, the present embodiment provides the advantage that it is possible to reduce a quantization error since each transistor included in the constant correction circuit has a sufficiently small resistance value.

Second Embodiment

Figure 13:
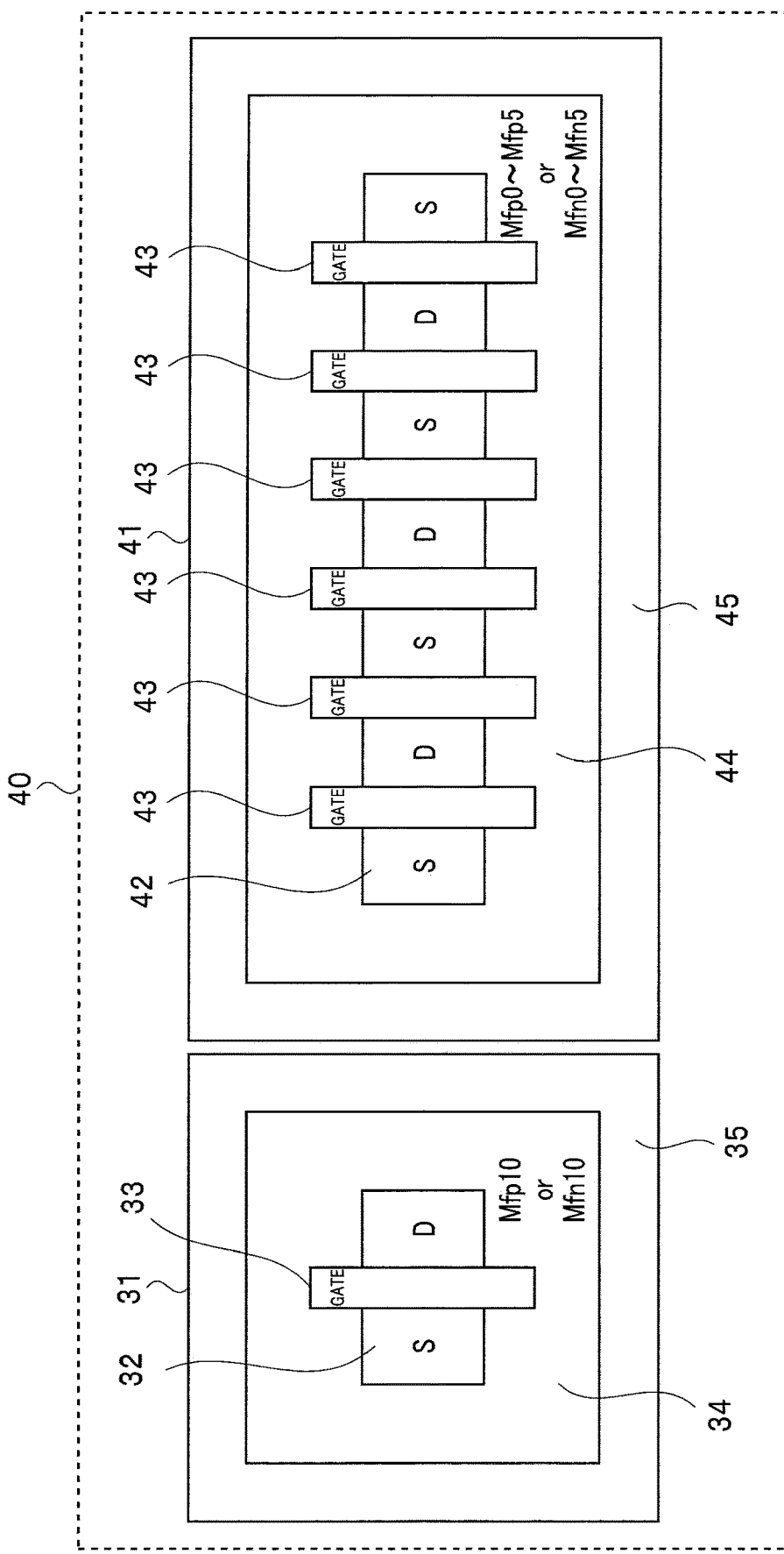
FIG. 13 is an explanatory diagram illustrating an example of a specific arrangement configuration of a circuit formation region 40 of a constant correction circuit 15 formed on a semiconductor substrate in a second embodiment.

FIG. 13 is an explanatory diagram illustrating an example of a specific arrangement configuration of a circuit formation region 40 of the constant correction circuit 15 formed on a semiconductor substrate in a second embodiment. Note that arrangement configurations of the fine P buffer 15p and the fine N buffer 15n included in the constant correction circuit 15 are identical to each other, and thus the following description is made only on the fine P buffer 15p for simplification of description.

The circuit formation region 40 includes a circuit region 31 in which the transistor MfpE is formed, and a circuit region 41 in which the transistors Mfp0 to Mfp5 are formed.

An active region 32 including a source (S) and a drain (D), and a gate (GATE) 33 are formed in the circuit region 31. The transistor MfpE is constituted by the active region 32 and the gate 33. In addition, an active region 42 including a plurality of sources (S) and drains (D), and a plurality of gates (GATE) 43 are formed in the circuit region 41. The transistors Mfp0 to Mfp5 are constituted by the plurality of gates 43 and the sources and drains at ends of the gates 43. Power voltage is supplied to the source of each transistor Mfp through a contact (not illustrated), and the drain of each transistor Mfp is connected in common through a contact (not illustrated) and connected with a contact connected with the drain of the transistor MfpE. The drain of the transistor MfpE is connected with the node Sp in FIG. 2 through a contact (not illustrated).

In the circuit region 31, an element separation region 34 is formed around the active region 32, and the element separation region 34 is surrounded by a guard ring 35. The guard ring 35 is connected with the semiconductor substrate through a contact (not illustrated). In the circuit region 41, an element separation region 44 is formed around the active region 42, and the element separation region 44 is surrounded by a guard ring 45. The guard ring 45 is connected with the semiconductor substrate through a contact (not illustrated).

Accordingly, in the circuit regions 31 and 41, the active region 32 and the active region 42 are separated, and each region is surrounded by the guard ring 35 or the guard ring 45. Thus, the circuit region 31 and the circuit region 41 are separated from each other in terms of capacitance, and the pin capacitance substantially depends on drain capacitance of the transistor MfpE or MfnE formed in the circuit region 31. Thus, a sufficient electro-statics discharge (ESD) resistance can be obtained by optimizing designing of the transistors MfpE and MfnE irrespective of designing of the transistors Mfp of the fine P buffer 15p and the transistors Mfn of the fine N buffer 15n.

As described above, in the present embodiment, a fine calibration adjustment transistor and an ESD resistance transistor included in a constant correction circuit are connected in series with each other and separated from each other by a guard ring. Thus, a sufficient ESD resistance can be obtained irrespective of characteristics of the fine calibration adjustment transistor.

Third Embodiment

Figure 14:
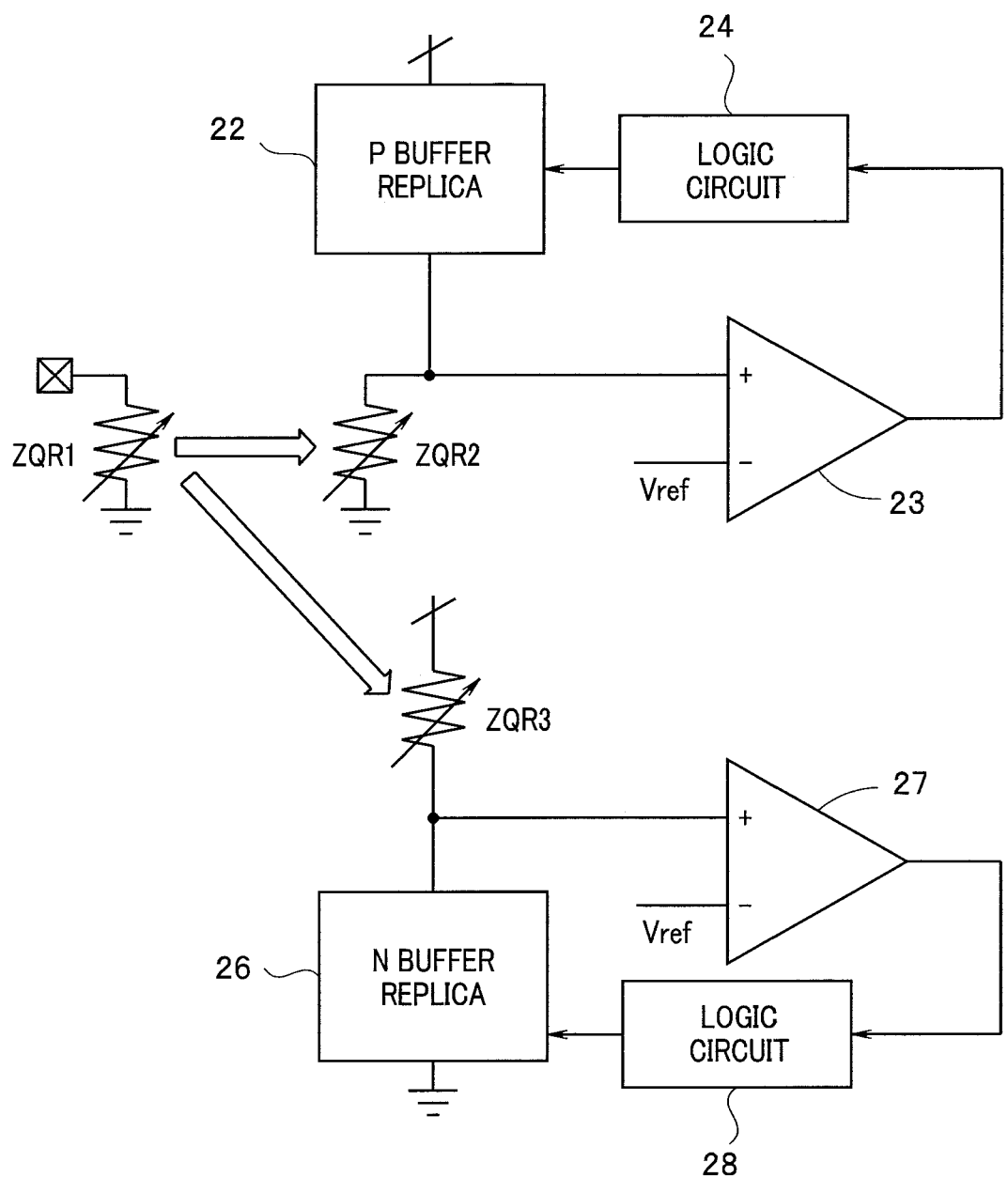
FIG. 14 is a block diagram illustrating a third embodiment.

FIG. 14 is a block diagram illustrating a third embodiment. In FIG. 14, a component identical to a component in FIG. 3 is denoted by an identical reference sign, and description is omitted. The present embodiment achieves high-speed calibration calculation.

In the calibration calculation circuit 12 in FIG. 3, a code set to the transistors Mp and Mfp is calculated through the loop formed by the P buffer replica 22, the comparator 23, and the logic circuit 24. The calculated code is provided to the P buffer replica 25, and a code set to the transistors Mn and Mfn is determined through the loop formed by the P buffer replica 25, the N buffer replica 26, the comparator 27, and the logic circuit 28. However, in the present embodiment, the code set to the transistors Mp and Mfp and the code set to the transistors Mn and Mfn are simultaneously calculated.

A calibration calculation circuit in FIG. 14 is different from the calibration calculation circuit 12 in FIG. 3 in that internal resistors ZQR1 and ZQR2 are employed in place of the external resistor ZQR and an internal resistor ZQR3 is employed in place of the P buffer replica 25. The internal resistor ZQR2 has one end connected with a positive input end of the comparator 23, and the other end connected with the reference potential point. The internal resistor ZQR3 has one end connected with the power source terminal, and the other end connected with the positive input end of the comparator 27.

The internal resistor ZQR1 is set to a desired resistance value through adjustment work by a user. Resistance values of the internal resistors ZQR2 and ZQR3 are set to be equal to the resistance value of the internal resistor ZQR1 by setting an adjustment value of the internal resistor ZQR1 to the internal resistors ZQR2 and ZQR3.

In this state, the comparator 23 compares voltage supplied to the positive input end with the voltage Vref, which is equal to ½ of power voltage applied to the P buffer replica 22, and outputs a result of the comparison to the logic circuit 24. The comparator 27 compares voltage supplied to the positive input end, which is voltage at a connection point of the internal resistor ZQR3 and the N buffer replica 26, with the voltage Vref, and outputs a result of the comparison to the logic circuit 28.

In this manner, the code set to the transistors Mp and Mfp is calculated by the logic circuit 24 through the loop formed by the P buffer replica 22, the comparator 23, and the logic circuit 24 so that the resistance value of the P buffer replica 22 matches the resistance value of the internal resistor ZQR2. In addition, the code set to the transistors Mn and Mfn is calculated by the logic circuit 28 through the loop formed by the N buffer replica 26, the comparator 27, and the logic circuit 28 so that the resistance value of the N buffer replica 26 matches the resistance value of the internal resistor ZQR3. The loops simultaneously operate to simultaneously calculate a code for the transistors Mp and Mfp and a code for the transistors Mn and Mfn.

As described above, the present embodiment has an effect of simultaneously obtaining a code for the transistors Mp and Mfp and a code for the transistors Mn and Mfn.

Fourth Embodiment

Figure 15:
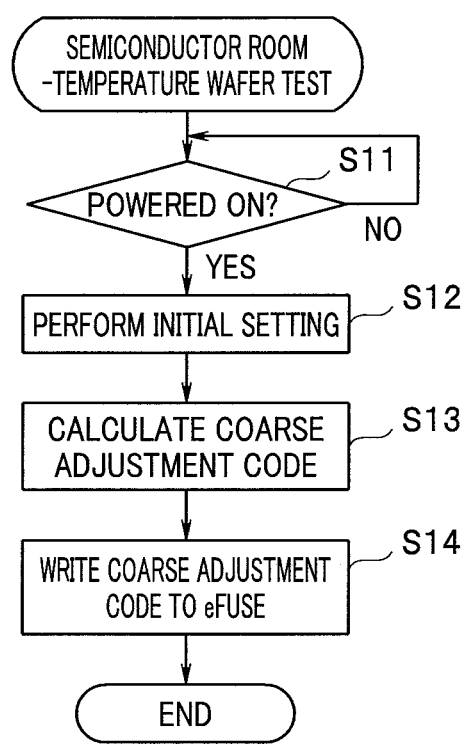
FIG. 15 is a flowchart illustrating a process of calibration calculation in a semiconductor room-temperature wafer test.
Figure 16:
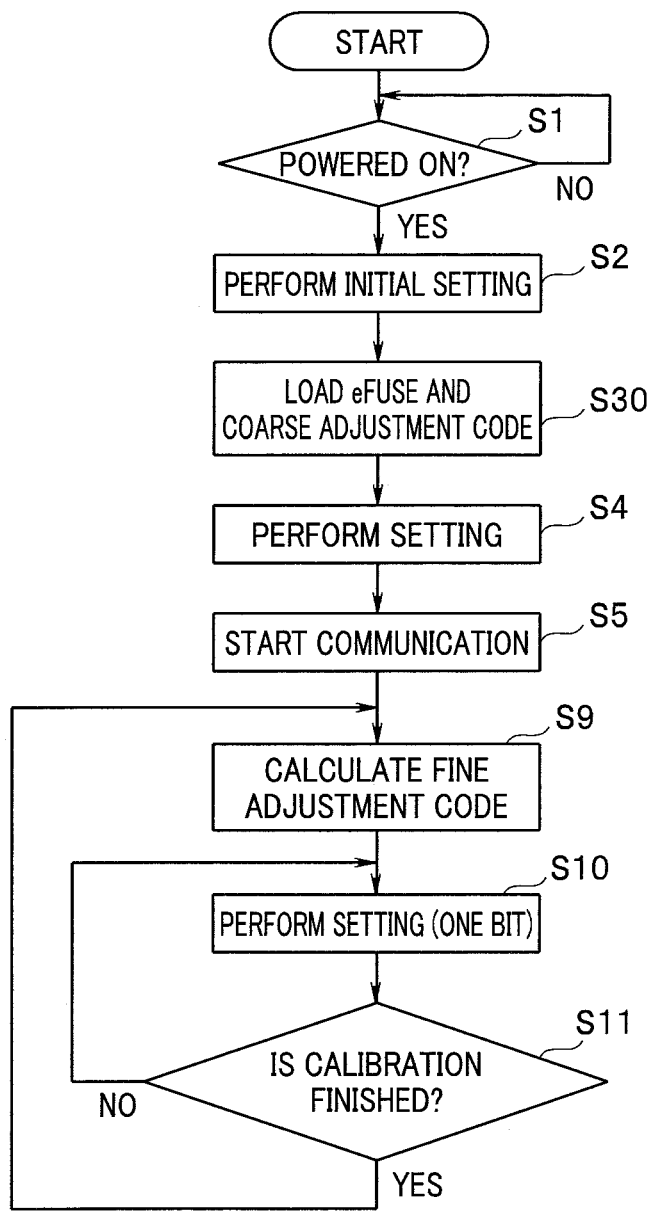
FIG. 16 is a flowchart illustrating an operation process employed in a fourth embodiment.
Figure 17:
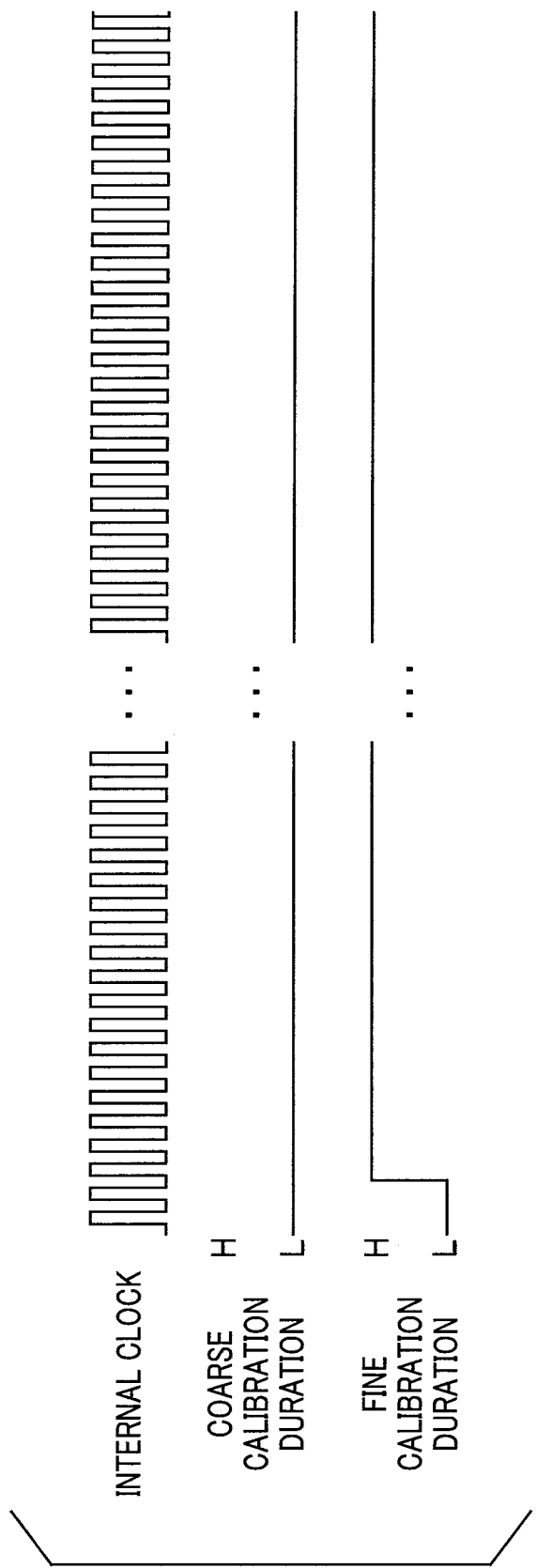
FIG. 17 is a timing chart illustrating operation in the fourth embodiment.

FIGS. 15 and 16 are flowcharts illustrating operation processes employed in a fourth embodiment. In FIGS. 15 and 16, a procedure identical to a procedure in FIG. 9 is denoted by an identical reference sign, and description is omitted. FIG. 17 is a timing chart illustrating operation in the fourth embodiment.

An example in which the coarse calibration duration is determined and coarse calibration and fine calibration are performed by using a result of the determination is described above with reference to the process of FIG. 9. However, coarse calibration after power-on can be unnecessary, depending on temperature and voltage variation.

Thus, in the present embodiment, calibration processing in actual use after factory shipment is simplified so that mounting can be easily performed.

FIG. 17 illustrates the internal clock used in the output buffer circuit 3a and the fine calibration duration (H duration) of the constant correction circuit 15. FIG. 17 indicates that no coarse calibration duration is provided after power-on but the fine calibration duration is set across the entire duration after power-on so that calibration is constantly performed.

In the present embodiment, calibration calculation for coarse calibration is performed before factory shipment, and a coarse adjustment code obtained through the calculation is recorded in a recording medium (not illustrated) in the output buffer circuit 3a. The recording medium may be, for example, an eFUSE memory.

FIG. 15 illustrates a process of calibration calculation in a semiconductor room-temperature wafer test. Processing at steps S11 to S13 in FIG. 15 is same as processing at steps S1 to S3 in FIG. 9. In the semiconductor room-temperature wafer test, the control circuit 11 performs various kinds of initial setting in the output buffer circuit 3a at step S12 after the output buffer circuit 3a is powered on. Subsequently at step S13, the control circuit 11 generates a coarse adjustment code as a combination of control signals used for coarse calibration.

Note that, in this case, the transistors Mp and Mn are each set to a resistance value for obtaining a correction range with which resistance value variation due to process dependency can be corrected. A fixed code may be generated for the transistors Mfp and Mfn so that the median of maximum resistance values obtained by the transistors Mfp and Mfn or a value close to the median is obtained.

In the present embodiment, at step S14, the control circuit 11 writes and records the generated coarse adjustment code to a recording medium such as an eFUSE memory.

FIG. 16 illustrates operation in a normal use state after factory shipment. In FIG. 16, a step identical to a step in FIG. 9 is denoted by an identical reference sign. In the present embodiment, after the initial setting at step S2, the control circuit 11 reads a coarse adjustment code from a recording medium (for example, an eFUSE memory) in which the coarse adjustment code is recorded (step S30). Then, the control circuit 11 performs setting at step S4, and then starts communication (step S5).

The control circuit 11 executes step S9 after step S5 and instructs the calibration calculation circuit 12 to calculate a fine adjustment code for executing fine calibration. The calculated fine adjustment code is set to the transistors Mfp and Mfn of the output buffer 10 at steps S10 and S11.

In the present embodiment, the coarse adjustment code calculated in the semiconductor room-temperature wafer test are fixedly used for the transistors Mp and Mn of the output buffer 10 in actual use. Then, the control circuit 11 drives the transistors Mfp and Mfn with the fine adjustment code calculated as needed after communication starts.

Note that the resistance values of the transistors Mfp and Mfn of a fine P buffer 16p and a fine N buffer 16n are set to obtain a correction range with which resistance value variation due to power voltage and temperature dependency can be corrected. For example, when a coarse adjustment code is calculated based on an assumption of temperature of 25° C. and power voltage of 1.2V, the resistance values of the transistors Mfp and Mfn are each set to a correction range with which variation in a power voltage variation range of ±60 mV can be corrected in a temperature range of −40° C. to 125° C. The transistors Mfp and Mfn are each set to a resolution at which no glitch is generated by resistance value change of one bit.

As described above, in the present embodiment, coarse calibration is performed by using a coarse adjustment code calculated before factory shipment, and then in actual use, only fine calibration is constantly performed as calibration for power voltage and temperature dependency of output impedance. Accordingly, in the present embodiment, effects same as effects of the above-described embodiments are obtained, and in actual use, it is not necessary to perform coarse calibration and determine the coarse calibration duration, and thus an advantage that mounting can be easily performed is provided.

Fifth Embodiment

Figure 18:
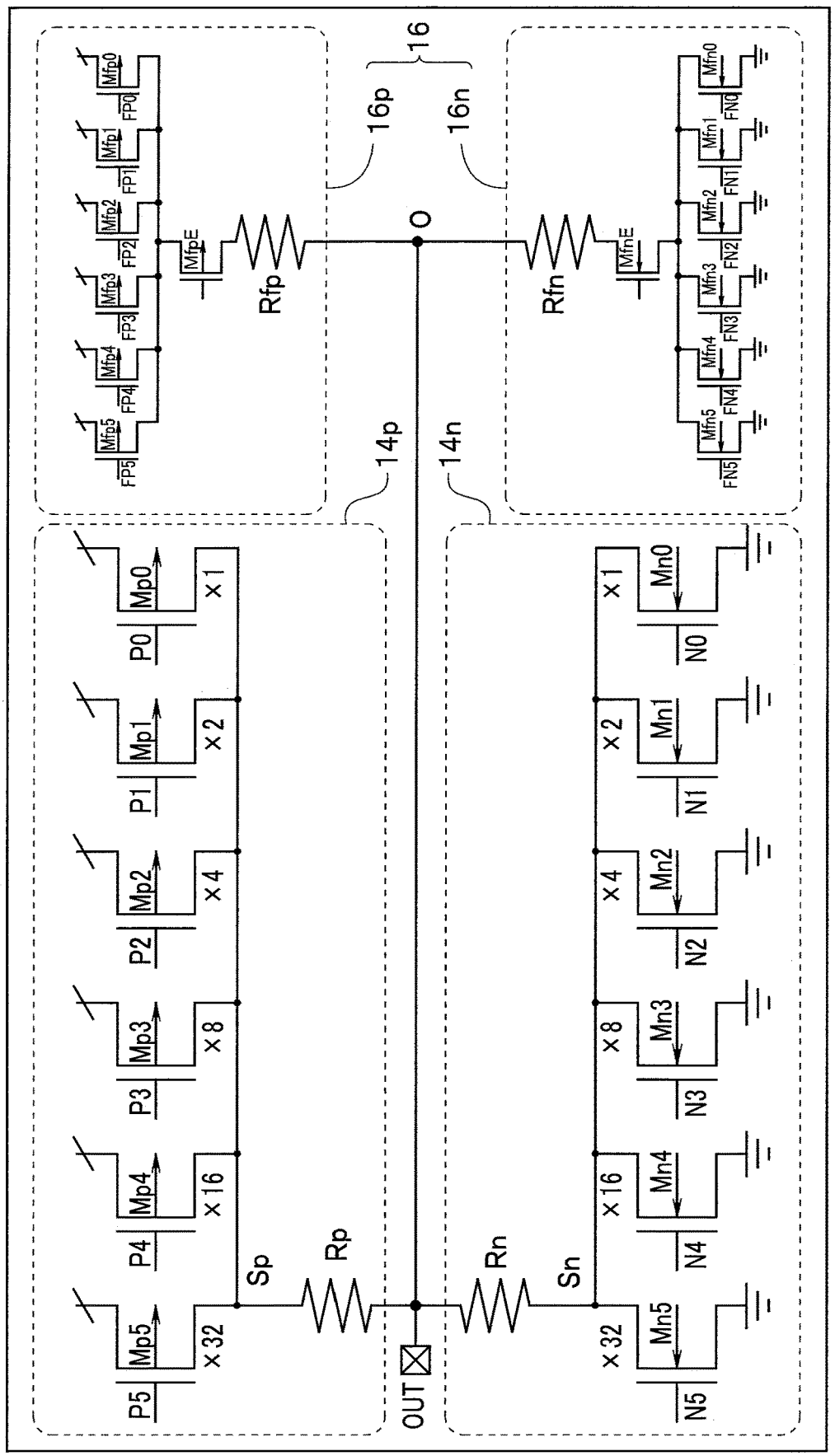
FIG. 18 is a circuit diagram illustrating a fifth embodiment.

FIG. 18 is a circuit diagram illustrating a fifth embodiment. In FIG. 18, a component identical to a component in FIG. 2 is denoted by an identical reference sign, and description is omitted. The present embodiment improves linearity of impedance of a fine adjustment buffer, thereby achieving further improvement of signal integrity.

An output buffer in the present embodiment is different from the output buffer in FIG. 2 in that a constant correction circuit 16 including the fine P buffer 16p and the fine N buffer 16n is employed in place of the fine P buffer 15p and the fine N buffer 15n, respectively. The other configuration is same as the configuration of each above-described embodiment.

The fine P buffer 16p is the fine P buffer 15p additionally including a resistor Rfp, and the fine N buffer 16n is the fine N buffer 15n additionally including a resistor Rfn. The source of the transistor MfpE is connected not with the node Sp but with the node O through the resistor Rfp. The source of the transistor MfnE is connected not with the node Sn but with the node O through the resistor Rfn.

The resistors Rfp and Rfn are inserted to improve linearity of the impedance of the fine adjustment buffer.

The output buffer in the present embodiment may be used in accordance with a process same as the process of FIG. 9 or may be used in accordance with the processes of FIGS. 15 and 16 in the fourth embodiment.

In a case of use in accordance with the processes of FIGS. 15 and 16, a coarse adjustment code obtained through calculation for coarse calibration before factory shipment is set to the transistors Mp and Mn of the P buffer 14p and the N buffer 14n.

Note that, in this case, the transistors Mp and Mn are set to resistance values for obtaining a correction range with which resistance value variation due to process dependency can be corrected. In addition, the transistors Mfp and Mfn of the fine P buffer 16p and the fine N buffer 16n are each set to resistance values for obtaining a correction range with which resistance value variation due to power voltage and temperature dependency can be corrected, and are each set to a resolution at which no glitch is generated by resistance value change of one bit.

The other effects are same as effects of the above-described embodiments. Moreover, in the present embodiment, it is possible to improve linearity of the impedance of the fine adjustment buffer, thereby achieving further improvement of signal integrity.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
   a buffer configured to perform data transmission by turning on and off a first output transistor group and a second output transistor group;
   a first correction circuit including the first output transistor group and configured to calibrate a resistance value of the buffer by controlling on-off state of each of first transistors of the first output transistor group, wherein each of the first transistors is set to a resistance value with a different weight;
   a second correction circuit including the second output transistor group and configured to calibrate the resistance value of the buffer by controlling an on-off state of each of second transistors of the second output transistor group, wherein each of the second transistors is set to a resistance value equal to or smaller than the resistance value of a transistor with a lightest weight among the first transistors; and
   a control circuit configured to:
      cause the calibration by the first correction circuit to be performed in a non-communication duration other than a duration of data transmission from the buffer;
      control to start the data transmission from the buffer; and
      cause the calibration by the second correction circuit to be performed in at least the duration of the data transmission from the buffer after a duration of the calibration by the first correction circuit,
   wherein the first output transistor group has a first variable resistance value and the second output transistor group has a second variable resistance value that is equal to or less than the first variable resistance value.

2. The semiconductor device according to claim 1, wherein
   the first correction circuit is used to perform coarse adjustment of the resistance value, and
   the second correction circuit is used to perform fine adjustment of the resistance value.

3. The semiconductor device according to claim 1, wherein the control circuit employs a thermometer code as a code for controlling the on-off state of each of the second transistors.

4. The semiconductor device according to claim 1, wherein the control circuit periodically causes the calibration by the second correction circuit to be performed.

5. The semiconductor device according to claim 1, wherein the second output transistor group further includes a switching transistor connected in series with a plurality of the second transistors that are connected in parallel and contribute to the calibration.

6. The semiconductor device according to claim 5, wherein the second output transistor group has an arrangement configuration in which an active area of the switching transistor and an active area of the second transistors are separated from each other.

7. The semiconductor device according to claim 1, wherein, in the calibration by, the first correction circuit, the control circuit sets the resistance value calibrated by the second transistors to a median of a range of the calibration by the second correction circuit or a value close to the median.

8. The semiconductor device according to claim 1, further comprising a calibration calculation circuit configured to generate a code for controlling the on-off states of the first and second transistors.

9. The semiconductor device according to claim 1, wherein the control circuit causes the calibration by the first correction circuit to be performed after all the second transistors are turned on or off as a result of the calibration by the second correction circuit.

10. The semiconductor device according to claim 8, wherein the calibration calculation circuit includes a replica circuit of the first and second output transistor groups and generates the code by performing loop control of the replica circuit based on voltage obtained by a reference resistor and the replica circuit.

11. The semiconductor device according to claim 10, wherein the calibration calculation circuit generates the code by performing the loop control a plurality of times and obtaining an average.

12. The semiconductor device according to claim 10, wherein the calibration calculation circuit includes a first reference resistor corresponding to a positive transistor among the first and second transistors, includes a second reference resistor corresponding to a negative transistor among the first and second transistors, and simultaneously calculates a code for controlling an on-off state of the positive transistor and a code for controlling an on-off state of the negative transistor.

13. The semiconductor device according to claim 1, wherein the control circuit performs the calibration by the first correction circuit in a non-communication duration before factory shipment and performs only the calibration by the second correction circuit in actual use.

14. The semiconductor device according to claim 13, wherein, in calibration performed before the factory shipment, the control circuit calculates and records a code for controlling the on-off states of the first and second transistors, and in the actual use, the control circuit fixes the on-off state of each of the first transistors based on the recorded code and constantly performs the calibration by the second correction circuit.

15. The semiconductor device according to claim 13, wherein
   the first correction circuit is used to correct resistance value variation due to process dependency, and
   the second correction circuit is used to correct resistance value variation due to power voltage and temperature dependency.

16. The semiconductor device according to claim 5, further comprising a resistor connecting the switching transistor and an output end of the buffer to improve linearity.

17. A memory device comprising:
   a non-volatile memory;
   a memory controller configured to control the non-volatile memory; and
   an interface circuit configured to perform data communication between the non-volatile memory and the memory controller and including a buffer, a first correction circuit, a second correction circuit, and a control circuit, the buffer being configured to perform data transmission by turning on and off a first output transistor group and a second output transistor group,
   the first correction circuit including the first output transistor group and being configured to calibrate a resistance value of the buffer by controlling an on-off state of each of first transistors of the first output transistor group, wherein each of the first transistors is set to a resistance value with a different weight,
   the second correction circuit including the second output transistor group and being configured to calibrate the resistance value of the buffer by controlling an on-off state of each of second transistors of the second output transistor group, wherein each of the second transistors is set to a resistance value equal to or smaller than the resistance value of a transistor with a lightest weight among the first transistors, the control circuit being configured to:
  cause the calibration by the first correction circuit to be performed in a non-communication duration other than a duration of data transmission from the buffer;
  control to start the data transmission from the buffer; and
  cause the calibration by the second correction circuit to be performed in at least the duration of the data transmission from the buffer after a duration of the calibration by the first correction circuit,
wherein the first output transistor group has a first variable resistance value and the second output transistor group has a second variable resistance value that is equal to or less than the first variable resistance value.

18. The memory device according to claim 17, wherein
the first correction circuit is used to perform coarse adjustment of the resistance value, and
the second correction circuit is used to perform fine adjustment of the resistance value.

\* \* \* \* \*